(12) United States Patent
Reul et al.

(10) Patent No.: US 12,738,395 B2
(45) Date of Patent: Sep. 15, 2026

(54) RIBBON CABLE FOR DETECTING A BREAK, CONNECTION ASSEMBLY WITH COMPOSITE PANEL, METHOD FOR DETECTING A BREAK, AND USE OF THE RIBBON CABLE

(71) Applicant: SAINT-GOBAIN GLASS FRANCE, Courbevoie (FR)

(72) Inventors: Bernhard Reul, Herzogenrath (DE); Francois Hermange, Herzogenrath (DE); Hadi Rastegar, Herzogenrath (DE)

(73) Assignee: SAINT-GOBAIN SEKURIT FRANCE, Thourotte (FR)

( * ) Notice: Subject to any disclaimer, the term of this patent is extended or adjusted under 35 U.S.C. 154(b) by 217 days.

(21) Appl. No.: 18/692,139

(22) PCT Filed: Sep. 12, 2022

(86) PCT No.: PCT/EP2022/075201
§ 371 (c)(1),
(2) Date: Mar. 14, 2024

(87) PCT Pub. No.: WO2023/052100
PCT Pub. Date: Apr. 6, 2023

(65) Prior Publication Data

US 2024/0274323 A1 Aug. 15, 2024

(30) Foreign Application Priority Data

Sep. 29, 2021 (DE) ..................... 10 2021 125 178.8

(51) Int. Cl.
*H01B 7/32* (2006.01)
*G01R 31/58* (2020.01)
(Continued)

(52) U.S. Cl.
CPC ............. *H01B 7/328* (2013.01); *G01R 31/58* (2020.01); *H01B 7/041* (2013.01); *H01B 7/0838* (2013.01)

(58) Field of Classification Search
CPC ...... H01B 7/02; H01B 7/0208; H01B 7/0045; H01B 7/0054; H01B 7/04; H01B 7/08;
(Continued)

(56) References Cited

U.S. PATENT DOCUMENTS 3,805,213 A * 4/1974 Austin .................. H05K 1/118
174/117 FF
4,748,293 A * 5/1988 Kikuchi ............... H01B 7/0838
174/268
(Continued)

FOREIGN PATENT DOCUMENTS

CN 112562891 A 3/2021
DE 93 13 394 U1 10/1993
(Continued)

OTHER PUBLICATIONS

Notice of Reasons for Rejection as issued in Japanese Patent Application No. 2024-519314, dated Apr. 22, 2025.
(Continued)

*Primary Examiner* — William H. Mayo, III
(74) *Attorney, Agent, or Firm* — CUSHMAN PARTNERS, LLC

(57) ABSTRACT

A ribbon cable for break detection in a laminated panel including a carrier film that supports one or more electrical conductor tracks and defines first and second connection regions at opposite ends. The first connection region is configured to be positioned between two panes of the laminated pane. The second connection region is configured to be routed out of the laminated pane between the panes. The conductor tracks are configured to electrically contact
(Continued)

an electrical functional element in the first connection region. The carrier film further supports an additional conductor track arranged as a loop, such that an ohmic resistance between ends of the additional conductor track can be measured to detect a break.

20 Claims, 5 Drawing Sheets

(51) Int. Cl.
*H01B 7/04* (2006.01)
*H01B 7/08* (2006.01)

(58) Field of Classification Search
CPC ........ H01B 7/0823; H01B 7/18; H01R 11/30; H01R 12/59; H01R 12/69; H01R 12/70; G02F 1/15
USPC ...... 174/110 R–117 FF; 439/67, 77; 359/265
See application file for complete search history.

(56) References Cited

U.S. PATENT DOCUMENTS

| | | | | |
|---|---|---|---|---|
| 7,108,515 | B2 * | 9/2006 | Tanabe | H05K 1/118 349/150 |
| 7,710,406 | B2 * | 5/2010 | Fujii | G06F 3/045 345/173 |
| 10,281,517 | B2 | 5/2019 | Zettler et al. | |
| 12,183,482 | B2 * | 12/2024 | Hermange | H01B 13/0036 |
| 2003/0112190 | A1 | 6/2003 | Baliarda et al. | |
| 2005/0035913 | A1 * | 2/2005 | Baranski | H01Q 13/16 343/713 |
| 2005/0191872 | A1 * | 9/2005 | Tanabe | H05K 1/118 439/67 |
| 2007/0097481 | A1 | 5/2007 | Burdis et al. | |
| 2007/0133078 | A1 * | 6/2007 | Fanton | B60J 3/04 359/265 |
| 2008/0169185 | A1 | 7/2008 | Burdis et al. | |
| 2015/0244089 | A1 * | 8/2015 | Reul | B32B 17/10495 156/182 |
| 2016/0036151 | A1 * | 2/2016 | Tominaga | H01R 43/16 29/874 |
| 2018/0301832 | A1 * | 10/2018 | Coakley | H05K 1/118 |

FOREIGN PATENT DOCUMENTS

| | | | | |
|---|---|---|---|---|
| DE | 42 35 063 | A1 | 4/1994 | |
| DE | 195 42 006 | A1 | 5/1997 | |
| DE | 101 06 125 | A1 | 8/2002 | |
| DE | 103 24 919 | A1 | 1/2004 | |
| DE | 103 19 606 | A1 | 11/2004 | |
| DE | 20 2004 019286 | U1 | 4/2006 | |
| DE | 10 2005 007427 | A1 | 8/2006 | |
| DE | 10 2005 049081 | B3 | 6/2007 | |
| DE | 10 2007 027296 | A1 | 12/2008 | |
| DE | 10 2008 026339 | A1 | 12/2009 | |
| DE | 20 2008 017611 | U1 | 4/2010 | |
| DE | 10 2013 001334 | A1 | 7/2014 | |
| DE | 10 2018 106175 | A1 | 9/2019 | |
| EP | 0 720 249 | A2 | 7/1996 | |
| EP | 0 867 752 | A1 | 9/1998 | |
| EP | 0 876 608 | B1 | 4/2002 | |
| EP | 0 847 965 | B1 | 10/2004 | |
| JP | 2001230504 | A * | 8/2001 | H05K 1/02 |
| JP | 2005-285887 | A | 10/2005 | |
| JP | 5936275 | B2 | 6/2016 | |
| WO | WO 2010/043598 | A1 | 4/2010 | |
| WO | WO 2011/033313 | A1 | 3/2011 | |
| WO | WO 2012/136411 | A1 | 10/2012 | |
| WO | WO 2021/156485 | A1 | 8/2021 | |

OTHER PUBLICATIONS

International Search Report as issued in International Patent Application No. PCT/EP2022/075201, dated Nov. 23, 2022.

* cited by examiner

RIBBON CABLE FOR DETECTING A BREAK, CONNECTION ASSEMBLY WITH COMPOSITE PANEL, METHOD FOR DETECTING A BREAK, AND USE OF THE RIBBON CABLE

CROSS-REFERENCE TO RELATED APPLICATIONS

This application is the U.S. National Stage of PCT/EP2022/075201, filed Sep. 12, 2022, which in turn claims priority to German patent application number 10 2021 125 178.8 filed Sep. 29, 2021. The content of these applications are incorporated herein by reference in their entirety

FIELD

The invention relates to a ribbon cable for breaking detection and to a connection assembly comprising a laminated pane and a ribbon cable according to the invention, a method for breaking detection and the use of the ribbon cable according to the invention.

BACKGROUND

Glazings in buildings and vehicles are increasingly provided with large-area, electrically conductive functional layers that are transparent to visible light. In particular, for reasons of energy-saving and comfort, high demands are placed on glazing units in terms of their thermal insulation properties. It is thus desirable to avoid high heat input from solar radiation, which leads to excessive heating of the interior and in turn results in high energy costs for the necessary air-conditioning. A remedy is provided by layer systems in which the light transmittance and thus the heat input due to sunlight can be controlled by applying an electrical voltage. Electrochromic layer systems are known, for example, from EP 0867752 A1, US 2007/0097481 A1 and US 2008/0169185 A1. Such layer systems are usually switched by external switches located in the surroundings of the glazing. Another function of electrical functional coatings is aimed at keeping the field of vision of a vehicle windshield free of ice and fogging. Electrical heating layers are known (see, for example, WO 2010/043598 A1), which cause a targeted heating of the pane by applying an electrical voltage. The voltage applied to the electric heating layer is generally controlled by external switches which are integrated in vehicles, for example, in a dashboard. For example, DE 10106125 A1, DE 10319606A1, EP 0720249 A2, US 2003/0112190 A1 and DE 19843338 C2 disclose the use of an electrical functional layer as a planar antenna. For this purpose, the functional layer is galvanically or capacitively coupled to a coupling electrode and the antenna signal is made available in the edge region of the pane. The antenna signal decoupled from the planar antenna is supplied to an antenna amplifier which is connected to the metal body in motor vehicles, as a result of which a reference potential which is effective with high frequencies is specified for the antenna signal.

Such laminated panes generally consist of at least two rigid individual glass panes, which are connected to one another in a planar-adhesive manner by a thermoplastic adhesive layer.

The electrical functional layer is located between the individual glass panes and is typically electrically connected to the external environment via a flat conductor. The reason for this is that suitable flat conductors generally have a total thickness of at most 0.3 mm. Such thin flat conductors can therefore be embedded without difficulty in the thermoplastic adhesive layer between the individual glass panes. Examples of flat conductors for contacting electrical functional layers in laminated panes in the vehicle sector can be found in DE 42 35 063 A1, DE 20 2004 019 286 U1, WO 2012/136411 A1 or DE 93 13 394 U1.

It is also known to use flat conductors in laminated panes with electro-optical components. These are flat structures with electrically controllable optical properties of an active layer. This means that the optical properties of the active layer and in particular its transparency, scattering behavior or luminosity can be controlled by an electrical voltage. Examples of electro-optical components are SPD elements (SPD=Suspended Particle Device), which are known, for example, from EP 0876608 B1 and WO 2011033313 A1, and PDLC elements (PDLC=Polymer Dispersed Liquid Crystal), which are known, for example, from DE 102008026339 A1.

Electrical contacting of electrical functional layers and electro-optical components usually takes place on current collectors ("bus bars") which are applied in the edge region of the functional layer or of the electro-optical component and contact them electrically conductively. By connecting the bus bars to an external voltage source, typically via flat conductors attached to the bus bars, a voltage is applied and the functional layer or electro-optical component is switched.

In practice, ribbon cables which are provided with a plurality of electrical conductor tracks are used for more complex control tasks. The electrical conductor tracks are very thin with thicknesses, for example, in the range of 0.03 mm to 0.1 mm and consist, for example, of copper, which has proven successful, since it has good electrical conductivity and good processability and at the same time the material costs are low. The electrical conductor tracks are typically arranged on electrically insulating, polymeric carrier films and covered by electrically insulating, polymeric cover films.

Such thin electrical conductor tracks, in particular when they are laminated into a laminated pane in portions, are sensitive to damage, for example by bending over a sharp edge or corrosion.

DE 10 2018 106 175 A1 discloses a monitoring device for detecting damage to a ribbon conductor of a coil spring of a motor vehicle. DE 103 24 919 A1 discloses in flat conductors, in particular a flexible printed circuit board, a film cable or film wiring harness, with conductor tracks extending between two contacting elements or functional units with at least one diagnostic line. A movable cable having a cable core and a braided shield surrounding the cable core into which an interruption detection wire is braided is known from CN 1 12 562 891 A.

SUMMARY

In contrast, the object of the present invention is to provide a ribbon cable with breaking detection or defect detection, which is nevertheless inexpensive to produce, is easy to handle and can be easily laminated into a laminated pane.

A further aspect of the invention relates to an improved connection assembly comprising a laminated pane and a ribbon cable for breaking detection, which ribbon cable is electrically contacting an electrical functional element of the laminated pane and enables flexible electrical contacting of the ribbon cable outside the laminated pane and a reliable checking of the integrity and intactness of the ribbon cable before, during and/or after the lamination.

According to the proposal of the invention, these and further objects are achieved by a ribbon cable according to the independent claim. Preferred embodiments and a connection assembly with ribbon cables arise from the dependent claims. A method according to the invention and an invention according to the invention arise from independent claims.

The invention relates to a ribbon cable, at least comprising:

- a carrier film having at least one, preferably at least two, electrical conductor tracks, wherein the carrier film has a first connection region on at least one first end and a second connection region on at least one second end, and
- wherein the carrier film has an additional conductor track which is designed to be loop-shaped, so that an ohmic resistance of the additional conductor track can be measured between its ends.

A further aspect of the invention relates to a connection assembly comprising a laminated pane and a ribbon cable according to the invention, at least comprising:

- a laminated pane formed of a first pane and a second pane, which are connected areally to one another by a thermoplastic intermediate layer,
- an electrical functional element between the two panes,
- a ribbon cable according to the invention comprising at least one electrical conductor track and at least one additional conductor track, wherein the ribbon cable has a first connection region at a first end and a second connection region at a second end, wherein the first connection region is arranged between the two panes and the second connection region is guided out of the laminated pane between the two panes, and wherein the electrical conductor tracks electrically contact the electrical functional element in the first connection region.

A further aspect of the invention relates to a method for producing a connection assembly according to the invention and comprises the following steps:

- a) providing a ribbon cable according to the invention with electrical conductor tracks and additional conductor track, wherein the ribbon cable has a first connection region at a first end and a second connection region at a second end,
- b) electrically conductively connecting the conductor tracks of the ribbon cable in the first connection region to an electrical functional element,
- c) arranging the ribbon cable between two panes in such a way that the first connection region is located between the two panes and the second connection region is guided out between the two panes,
- d) laminating the two panes via a thermoplastic intermediate layer after steps a), b) and c).

A further aspect of the invention relates to a method for breaking detection of a ribbon cable according to the invention or a connection assembly according to the invention, wherein

- a) a ribbon cable according to the invention or a connection assembly according to the invention is provided,
- b) an ohmic reference resistance value $R_{Ref}$ measured or calculated between the ends of the, preferably undamaged, additional conductor track,
- c) the ohmic resistance $R_{Mess}$ between the ends of the additional conductor track, and the resistance $R_{Mess}$ is compared to the reference resistance value $R_{Ref}$.

A further aspect of the invention relates to the use of a ribbon cable according to the invention or a connection assembly according to the invention as building glazing or vehicle glazing, preferably as vehicle glazing, in particular as a windshield or a roof panel of a motor vehicle.

The various embodiments of the invention may be implemented individually or in any combinations. In particular, the features mentioned above and to be explained below can be used not only in the specified combinations, but also in other combinations or alone without departing from the scope of the present invention.

BRIEF DESCRIPTION OF THE DRAWINGS

The invention is explained in more detail below with reference to exemplary embodiments, wherein reference is made to the accompanying figures. Elements that are identical or have the same effect are provided with the same reference signs. In a simplified, not-to-scale representation.

DETAILED DESCRIPTION

Figure 1A:
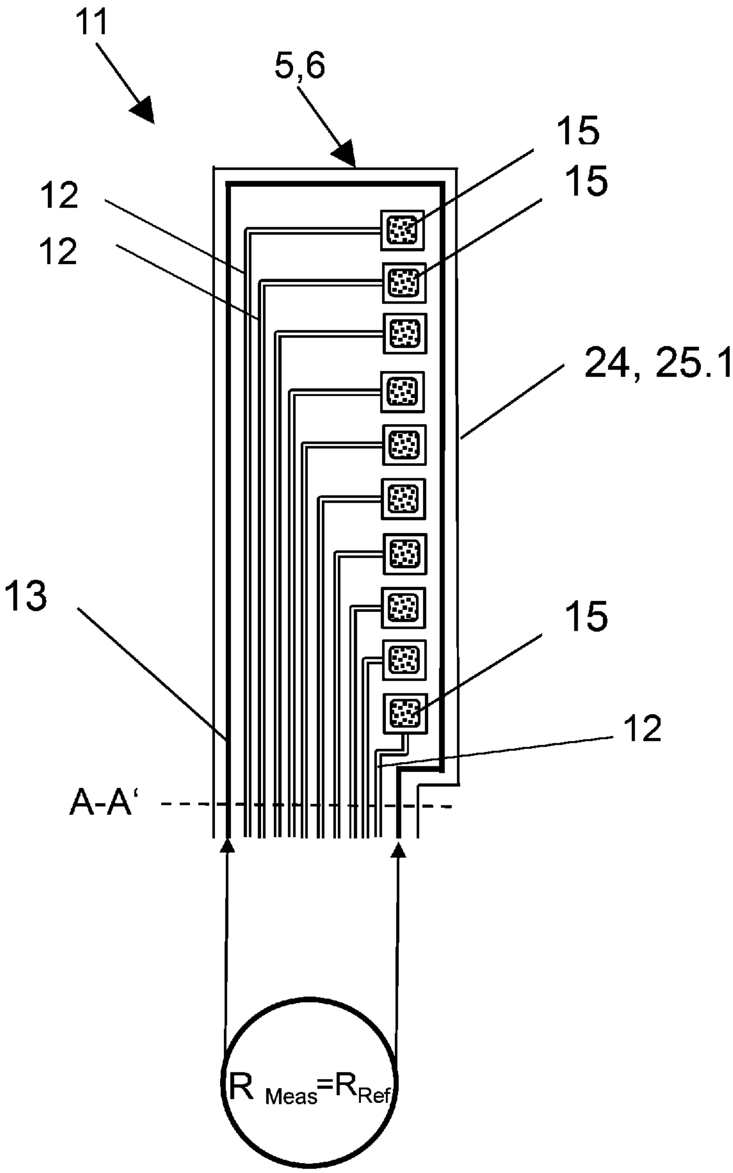
FIG. 1A is a schematic representation of the first connection region of a ribbon cable according to the invention.

An aspect of the invention relates to a ribbon cable, at least comprising: a carrier film having at least one, preferably at least two, electrical conductor tracks, wherein the carrier film has a first connection region on at least one first end and a second connection region on at least one second end, and wherein the carrier film has an additional conductor track which is designed to be loop-shaped, so that an ohmic resistance of the additional conductor track can be measured between its ends.

In the ribbon cable according to the invention, the first connection region can advantageously be arranged between two panes of a laminated pane and the second connection region can be guided out of the laminated pane between the two panes, and the electrical conductor track can electrically contact an electrical functional element in the first connection region.

In an advantageous embodiment of a ribbon cable according to the invention, the additional conductor track is arranged in the edge region of the carrier film. Preferably, the distance between the additional conductor track and the edge of the carrier film is less than 5 mm, particularly preferably equal to or less than 3 mm.

In a further advantageous embodiment of a ribbon cable according to the invention, the additional conductor track is guided substantially in a U-shaped manner around the first connection region.

In a further advantageous embodiment of a ribbon cable according to the invention, at least one electrical conductor track and the additional conductor track are arranged in one plane next to one another or in at least two, preferably in exactly two or exactly three or exactly four planes one above the other.

In a further advantageous embodiment of a ribbon cable according to the invention, at least one electrical conductor track is arranged on a first surface of an electrically insulating carrier film, and at least one further conductor track and/or the additional conductor track is arranged on the second surface of the carrier film.

In a further advantageous embodiment of a ribbon cable according to the invention, the at least one electrical conductor track and the additional conductor track are fixedly connected to the first or second surface of the carrier film, preferably via an adhesive surface.

A further aspect of the invention relates to a connection assembly comprising a laminated pane and a ribbon cable according to the invention, at least comprising:

- a laminated pane formed of a first pane and a second pane, which are connected areally to one another by a thermoplastic intermediate layer,
- an electrical functional element between the two panes,
- a ribbon cable according to the invention comprising at least one electrical conductor track and at least one additional conductor track, wherein the ribbon cable has a first connection region at a first end and a second connection region at a second end, wherein the first connection region is arranged between the two panes and the second connection region is guided out of the laminated pane between the two panes, and wherein the electrical conductor tracks electrically contact the electrical functional element in the first connection region.

The connection assembly according to the invention thus comprises a laminated pane formed of a first pane and a second pane, which are connected areally to one another by a thermoplastic intermediate layer.

The connection assembly further comprises an electrical functional element, which is arranged between the two panes, and a ribbon cable which serves to electrically contact the electrical functional element, in particular for the electrical connection of the functional element to a control electrical system. The ribbon cable has a first connection region and a second connection region, wherein the first connection region is located at a first end and the second connection region is located at a second end of the ribbon cable along an extension direction of the ribbon cable. The ribbon cable is partially laminated into the laminated pane, wherein the first end is located with the first connection region between the two panes and the second end is guided out of the laminated pane with the second connection region between the two panes and is located outside of the laminated pane. In this case, the electrical conductor tracks are in electrical contact with the electrical functional element in the first connection region and are preferably galvanically connected thereto.

The ribbon cable is generally a flat body with two opposite sides and can optionally be brought into a planar or curved shape. In the planar (i.e., non-curved) state, the flat conductor is arranged in a plane. The ribbon cable is generally elongated and has two ends along its extension direction.

An advantageous embodiment of a ribbon cable according to the invention comprises at least two electrical conductor tracks, wherein the electrical conductor tracks are arranged lying next to one another or one above the other at least in portions.

In a further, advantageous embodiment of the invention, at least two electrical conductor tracks are arranged one above the other in at least two, preferably in exactly two or exactly three or exactly four, planes. “One above the other” here means with respect to the extension plane of the ribbon cable, i.e., with respect to the plane that is spanned by the two larger dimensions of the ribbon cable. Advantageously, at least two conductor tracks are in each case arranged congruently in the projection orthogonal to the extension plane. Alternatively, the conductor track can also be designed to be larger in one plane and, substantially, partially or completely occupy the plane within the ribbon cable—preferably minus an insulating edge region. This increases the current-carrying capacity of this conductor track.

In an advantageous embodiment of a ribbon cable according to the invention, at least one electrical conductor track is arranged on a first surface of an electrically insulating carrier film and at least one further conductor track is arranged on the second surface (i.e., the surface opposite the first surface with respect to the carrier film) of the carrier film.

In a further advantageous embodiment of a ribbon cable according to the invention, the electrical conductor tracks are fixedly connected to the first or second surface of the carrier film, preferably via an adhesive surface. Alternatively, the carrier film can be coated with the electrical conductor tracks, in particular in the printing method, for example the screen printing method.

In a further advantageous embodiment of a ribbon cable according to the invention, the ribbon cable has insulating regions, preferably consisting of portions of an insulating film, between the conductor tracks of a plane. Portions of an insulating film are advantageously also arranged at the edge of the ribbon conductor.

In a further advantageous embodiment of a ribbon cable according to the invention, the conductor tracks have at least one electrically insulating cover film on their surfaces facing away from the carrier film. Preferably, the conductor tracks or the portions of an insulating film are fixedly connected to the cover film, for example via adhesive surfaces. The carrier film and the cover film together form an insulating sheath which encloses the electrical conductor tracks.

The width of the ribbon cable can be constant or can vary. In particular, the ribbon cable can be widened in the first connection region and/or the second connection region.

In a further advantageous embodiment of a ribbon cable according to the invention, the maximum width bF of the ribbon cable, preferably within the laminated pane and/or at the exit point from the laminated pane, is from 6 mm to 40 mm, preferably from 20 mm to 40 mm, and in particular from 25 mm to 30 mm. In a further advantageous embodiment of a ribbon cable according to the invention, the maximum thickness dF of the ribbon cable, preferably within the laminated pane and/or at the exit point from the laminated pane, is from 150 μm to 600 μm, preferably from 300 μm to 400 μm, and in particular from 300 μm to 350 μm. Ribbon cables with such maximum dimensions, in particular within the laminated pane and/or at the exit point from the laminated pane, can be laminated in particularly well or can impair the stability of the laminated pane or spoil the visual appearance thereof.

In an advantageous embodiment of the ribbon cable, this has a length of 5 cm to 150 cm, preferably of 10 cm to 100 cm, and in particular of 50 cm to 90 cm. It is understood that the length, width and thickness of the ribbon cable can be adapted to the requirement of the respective individual case. The direction of the length defines the extension direction of the ribbon cable.

The carrier film, the cover film and/or the insulating film preferably contain polyimide or polyester, particularly preferably polyethylene terephthalate (PET) or polyethylene naphthalate(PEN) or consists thereof. The cover film and/or the insulating film can also consist of an electrically-insulating lacquer, preferably a polymer lacquer. The cover film and/or the insulating film can also contain or consist of thermoplastics and elastomers, such as polyamide, polyoxymethylene, polybutylene terephthalate, or ethylene-propylene-diene rubber. Alternatively, potting materials, such as acrylate or epoxy resin systems, can be used as cover film and/or insulating film.

The carrier film, the cover film and/or the insulating film preferably have a thickness of 10 μm to 300 μm, particularly preferably of 25 μm to 200 μm, and in particular of 60 μm to 150 μm. The carrier film, the cover film and/or the insulating film are bonded to the conductor tracks via an adhesive layer, for example. The thickness of the adhesive layer is for example from 10 μm to 150 μm, and particularly preferably from 50 μm to 75 μm. Such carrier films, cover films and/or insulating films are particularly suitable for electrically insulating and mechanically stabilizing the conductor tracks and for protecting against mechanical damage and corrosion.

The electrical conductor tracks of the ribbon cable contain or consist preferably of a metal material, for example copper, aluminum, stainless steel, tin, gold, silver, or alloys thereof. If the electrical conductor tracks are produced as strips from a metal foil, the metal can be tin-plated partially or completely. This is particularly advantageous in order to achieve good solderability with simultaneous corrosion protection. In addition, the contacting with an electrically conductive adhesive is improved.

According to an embodiment, the electrical conductor tracks and/or the additional conductor track have a thickness dL of 10 μm to 300 μm, preferably from 10 μm to 150 μm, particularly preferably from 30 μm to 250 μm, and in particular from 50 μm to 150 μm. Such thin conductors are particularly flexible and can, for example, easily be laminated into and guided out of laminated panes. According to an embodiment, the electrical conductor tracks and/or the additional conductor track have a width bL of 0.05 mm to 40 mm, preferably of 1 mm to 20 mm, and in particular of 2 mm to 5 mm. Such widths are particularly suitable for achieving sufficient current-carrying capacity in conjunction with the thicknesses mentioned above.

Such ribbon cables are so thin that without difficulty they can be embedded in and guided out of the thermoplastic intermediate layer of a laminated pane between the individual panes. The ribbon cable is thus particularly suitable for contacting electrical functional elements in laminated panes.

Each electrical conductor track can be electrically contacted to two contact points spaced apart from one another along the conductor track. The contact points are regions of the conductor tracks at which electrical contact is possible. In the simplest embodiment, they are accessible regions of the electrical conductor tracks. The first connection region has a contact point of at least one of the electrical conductor tracks. The second connection region is typically located, but not necessarily, on the same side as the first connection region of the ribbon cable. The at least one second connection region has a contact point of at least one of the electrical conductor tracks. The connection regions of the ribbon cable serve for electrically contacting the conductor tracks, for which purpose any cover film and optionally insulation layer or carrier film is not present or is removed at least at the contact points so that the conductor tracks are accessible.

It is understood that the connection regions can be protected from corrosion by an electrically conductive coating, such as a tin plating, or an electrically non-conductive layer, such as a solder coating. This protective layer is usually removed, burned or otherwise penetrated only during electrical contacting in order to enable electrical contact. Insulation-free connection regions can be produced by window techniques during production or by subsequent removal, for example by laser ablation or mechanical removal. In window techniques, the conductor tracks are coated, for example glued or laminated, onto a carrier film through a cover film with corresponding recesses (windows) in the connection regions. Alternatively, the conductor tracks are laminated on both sides, wherein a cover film has corresponding recesses in the connection regions. During subsequent removal, corresponding recesses can be introduced into the cover film in the connection regions when the conductor tracks have been applied to a carrier film. In laminated ribbon cables, recesses in the connection regions can be introduced into a cover film and optionally the carrier film. However, it is also possible for the ribbon cable in the first connection region and in the second connection region to have, in each case, one or more apertures of the cover film and optionally of the carrier film. Each aperture extends here completely onto the conductor track, i.e., it forms a material-free passage onto the conductor track.

The connection regions are designed according to their respective use. In an advantageous embodiment, the contact points are designed as solder contact points. The electrical line connection between the connection regions of the ribbon cable and the electrical functional element and the at least one connection region is preferably implemented by soldering, bonding, welding, clamping, crushing or plugging. A soft soldering with a low-melting solder is preferred during soldering. Alternatively, the electrically conductive connection can be effected by adhesive bonding with an electrically conductive adhesive or by clamping, for example by means of a metal clamp, sleeve or plug connection. In the interior of the laminated pane, the electrical line connection can also be effected by a direct contact of the electrically conductive regions, wherein this arrangement is permanently laminated in the laminated pane and is thereby secured against slipping.

Advantageously, the ribbon cable is provided in the first or second connection region with an electrode field which comprises a plurality of individual electrodes which are electrically connected to the conductor tracks. This enables simple electrical contacting of the electrical functional element for its specific open-loop/closed-loop control.

In an advantageous embodiment of a connection assembly according to the invention, the ribbon cable comprises in the second connection region one or preferably multiple electrical connection regions in which the ribbon cable is releasably or fixedly connected to a connection cable.

The conductor tracks, i.e., the electrical conductor tracks and/or the additional conductor track are electrically connected at the second connection region to electrical cores of one or more connection cables, in particular round cables. Particularly preferably, the conductor tracks and the cores are electrically connected to one another by soldered connections, crimp connections, clamping connections or plug connections.

The connection cables can in turn have electrical connection means, such as plugs or sockets, at their end remote from the connection region, which connection means makes the connection assembly connectable to an on-board electronics system or other control and evaluation units.

In a further advantageous embodiment, the connection region or the electrical connection means can be surrounded by one or more protective housings. The one or more protective housings increase the mechanical stability of the connection regions or the connection means, in particular during the production of the connection assembly, and thus reduce the rejection of defective articles, which in turn corresponds to a cost saving. The at least one protective housing is arranged in such a way that it comes to rest over the one or more connection regions or connection means, and preferably the outer shape of the connection regions or connection means is reproduced. It is thus possible to achieve a form-fitting housing of the connection region or of the connection means.

The at least one protective housing serves to mechanically protect the connection region or connection means and is advantageously designed such that it counteracts any deformations of the connection region or connection means during the production of the connection assembly, in particular when the laminated panes are laminated under vacuum and at high temperatures.

In this case, the protective housing can consist of a correspondingly solid plastic, e.g., polyimide (PI) or PA66 in conjunction with glass fibers. Particularly advantageously, the at least one protective housing consists for this purpose of a material which is harder than the material from which the connection regions and means are made. The material hardness is determined according to the known common methods, for example according to ISO 14577, as used at the time of the application or at the priority date.

The protective housing can be produced, for example, in an injection-molding or 3-D printing method. For example, the protective housing can be bonded to the one or more connection regions. However, a common production with the one or more connection regions, for example by injection molding, is also possible.

The connection assembly according to the invention comprises a laminated pane with an electrical functional element which is arranged in the interior of the laminated pane. The electrical functional element can be any electrical structure which fulfills an electrical function and requires open-loop/closed-loop control by an external control electrical system, so that the use of a ribbon cable with a plurality of conductor tracks is technically expedient.

Preferably, the electrical functional element is an advantageously large-area, electrically conductive and advantageously transparent layer (electrical functional layer), as described at the outset. The electrical functional layer or a carrier film with the electrical functional layer can be arranged on a surface of an individual pane. For example, the electrical functional layer is located on an inner surface of the one and/or the other pane. Alternatively, the electrical functional layer can be embedded between two thermoplastic films of the intermediate layer. The electrical functional layer is then preferably applied to a carrier film or carrier pane. The carrier film or carrier pane preferably contains a polymer, in particular polyvinyl butyral (PVB), ethylene vinyl acetate (EVA), polyurethane (PU), polyethylene terephthalate (PET) or combinations thereof.

The electrical functional layer is preferably arranged on a surface of at least one pane and covers or overlaps the surface of the pane partially, but preferably over a large area. The expression "over a large area" means that at least 50%, at least 60%, at least 70%, at least 75% or preferably at least 90% of the surface of the pane is covered by the functional layer. However, the functional layer can also extend over smaller portions of the surface of the pane. The functional layer is preferably transparent to visible light. In an advantageous embodiment, the functional layer is an individual layer or a layer structure of multiple individual layers having a total thickness less than or equal to 2 μm, particularly preferably less than or equal to 1 μm.

Within the meaning of the present invention, "transparent" means that the overall transmittance of the glazing unit complies with the legal requirements for windshields and front side windows and preferably has a transmittance for visible light of more than 70% and, in particular, of more than 75%. For rear side panes and rear panes, "transparent" can also mean 10% to 70% light transmission. Accordingly, "opaque" means a light transmission of less than 15%, preferably less than 5%, in particular 0%.

For example, the electrical functional layer contains at least one metal, preferably silver, nickel, chromium, niobium, tin, titanium, copper, palladium, zinc, gold, cadmium, aluminum, silicon, tungsten or alloys thereof, and/or at least one metal oxide layer, preferably tin-doped indium oxide (ITO), aluminum-doped zinc oxide (AZO), fluorine-doped tin oxide (FTO, SnO2:F) or antimony-doped tin oxide (ATO, SnO2:Sb). Transparent electrically conductive layers are known, for example, from DE 20 2008 017 611 U1 and EP 0 847 965 B1. They consist for example of a metal layer, such as a silver layer or a layer of a silver-containing metal alloy. Typical silver layers preferably have thicknesses of 5 nm to 15 nm, particularly preferably 8 nm to 12 nm. The metal layer can be sandwiched between at least two layers of dielectric material of the metal oxide type. The metal oxide preferably includes zinc oxide, tin oxide, indium oxide, titanium oxide, silicon oxide, aluminum oxide or the like, along with combinations of one or more thereof. The dielectric material can also contain silicon nitride, silicon carbide, aluminum nitride along with combinations of one or more thereof. This layer structure is generally obtained by a sequence of deposition processes which are carried out by a vacuum method, such as magnetic-field-assisted cathode sputtering or by chemical gas-phase deposition (CVD). Very fine metal layers, which in particular contain titanium or niobium, can also be provided on both sides of the silver layer. The lower metal layer serves as an adhesion and crystallization layer. The upper metal layer serves as a protective and getter layer in order to prevent a change in the silver during the further process steps.

Transparent electrical functional layers preferably have a sheet resistance from 0.1 ohm/sq to 200 ohm/sq, particularly preferably from 1 ohm/sq to 50 ohm/sq and very particularly preferably from 1 ohm/sq to 10 ohm/sq.

The electrical functional layer is preferably an electrically heatable layer through which the laminated pane is provided with a heating function. Such heatable layers are known to the skilled person per se. They typically contain one or more, for example, two, three or four electrically conductive layers. Such layers preferably contain or consist of at least one metal, for example silver, gold, copper, nickel and/or chromium, or a metal alloy and preferably contain at least 90% by weight of the metal, and in particular at least 99.9 wt % of the metal. Such coatings exhibit particularly advantageous electrical conductivity with simultaneous high transmission in the visible spectral range. The thickness of a single layer is preferably from 5 nm to 50 nm, more preferably from 8 nm to 25 nm. With such a thickness, an advantageously high transmission in the visible spectral range and a particularly advantageous electrical conductivity are achieved.

The electrical functional element can equally preferably be an electro-optical component, such as an electrochromic (EC) element, an SPD element or a PDLC element, as described at the outset. These are known per se to a person skilled in the art, and therefore they do not need to be explained in more detail. The electrical functional layer can also be a polymeric electrically conductive layer, for example containing at least one conjugated polymer or a polymer provided with conductive particles.

Electro-optical components, such as SPD or PDLC elements, are commercially available as multilayer films, wherein the active layer is arranged between two surface electrodes which serve to apply a voltage to control the active layer. As a rule, the two surface electrodes are arranged between two carrier films, typically made of PET. Commercially obtainable multilayer films are also covered on both sides with a protective film made of polypropylene or polyethylene which serve to protect the carrier films against contamination or scratching. During the production of the laminated pane, the electro-optical component is cut out of the multilayer film in the desired size and shape and is inserted between the films of an intermediate layer by means of which two glass panes are laminated with one another to form the laminated pane. A typical application is constituted by windshields with electrically controllable sun screens, which are known, for example, from DE 102013001334 A1, DE 102005049081 B3, DE 102005007427 A1 and DE 102007027296 A1.

In the connection assembly according to the invention, the electrical functional element is advantageously electrically connected to at least two bus bars, through which a current can be fed. The bus bars are preferably arranged in the edge region of the electrical functional element. The length of the bus bar is typically substantially equal to the length of the corresponding side edge of the electrical functional element, but can also be somewhat larger or smaller. Two bus bars are preferably arranged in the edge region along two opposite side edges of the functional element. The width of the bus bar is preferably from 2 mm to 30 mm, particularly preferably from 4 mm to 20 mm. The bus bars are typically each designed in the form of a strip, wherein the longer of its dimensions is referred to as the length and the shorter of its dimensions is referred to as the width. Such bus bars are designed, for example, as printed and burned-in conductive structures. The printed bus bar contains at least one metal, preferably silver. The electrical conductivity is preferably realized via metal particles, contained in the bus bar, particularly preferably via silver particles. The metal particles can be in an organic and/or inorganic matrix such as pastes or inks, and preferably as a fired screen printing paste with glass frits. The layer thickness of the printed bus bar is preferably 5 μm to 40 μm, particularly preferably 8 μm to 20 μm, and very particularly preferably 10 μm to 15 μm. Printed bus bars with these thicknesses are technically simple to realize and have an advantageous current-carrying capacity. Alternatively, the bus bar can, however, also be designed as a strip of an electrically conductive film. The bus bar then contains, for example, at least aluminum, copper, tinned copper, gold, silver, zinc, tungsten and/or tin, or alloys thereof. The strip preferably has a thickness of 10 μm to 500 μm, particularly preferably of 30 μm to 300 μm. Bus bars made of electrically conductive films with these thicknesses are technically simple to realize and have an advantageous current-carrying capacity. The strip can be electrically conductively connected to the electrically conductive structure, for example via a soldering compound, via an electrically conductive adhesive or by direct placement.

The laminated pane of the connection assembly according to the invention comprises a first pane and a second pane, which are preferably made of glass, and particularly preferably of soda-lime glass, as is customary for window panes. However, the panes may also be manufactured from other types of glass, e.g., quartz glass, borosilicate glass, or aluminosilicate glass, or from rigid, clear plastics, e.g., polycarbonate or polymethyl methacrylate. The panes may be clear, or also tinted or colored. If the laminated pane is used as a windshield, it should have sufficient light transmission in the central viewing area—preferably at least 70% in the main field of view A according to ECE-R43. The first pane and the second pane can also be referred to as outer and inner panes.

The first pane, the second pane, and/or the intermediate layer can have further, suitable coatings known per se, e.g., anti-reflective coatings, non-stick coatings, anti-scratch coatings, photocatalytic coatings or sun protection coatings, or low-e coatings.

The thickness of the first pane and of the second pane can vary widely, and thus be adapted to the requirements in the individual case. The first pane and the second pane advantageously have standard thicknesses of 0.7 mm to 25 mm-preferably 1.4 mm to 2.5 mm for vehicle glass and preferably 4 mm to 25 mm for furniture, devices, and buildings, and in particular for electric heaters.

The size of the panes can vary widely and depends upon the size of the use according to the invention. The first and the second panes have surfaces of 200 $cm^2$ up to 20 $m^2$, as is usual, for example, in vehicle construction and the architectural sector.

A further aspect of the invention relates to a method for producing a connection assembly according to the invention and comprises the following steps:

a) providing a ribbon cable according to the invention with electrical conductor tracks and additional conductor track, wherein the ribbon cable has a first connection region at a first end and a second connection region at a second end,
b) electrically conductively connecting the conductor tracks of the ribbon cable in the first connection region to an electrical functional element,
c) arranging the ribbon cable between two panes in such a way that the first connection region is located between the two panes and the second connection region is guided out between the two panes,
d) laminating the two panes via a thermoplastic intermediate layer after steps a), b) and c).

Steps a), b) and c) can be carried out in any order.

According to an embodiment of the method according to the invention, an electrical connection region, preferably by soldered connections, crimp connections, clamping connections or plug connections, is formed between the second connection region of the ribbon cable and a connection cable, in particular a round cable, before or after the lamination of the two panes.

The two individual panes are connected during the lamination process preferably under the effect of heat, vacuum and/or pressure. Methods known per se for producing a laminated glass pane can be used. For example, so-called autoclave methods can be carried out at an elevated pressure of approximately 10 bar to 15 bar and at temperatures of 130° C. to 145° C. for approximately 2 hours. Vacuum bag or vacuum ring methods known per se operate, for example, at approx. 200 mbar and 80° C. to 110° C. The first pane, the thermoplastic intermediate layer, and the second pane can also be pressed in a calender between at least one pair of rollers to form a pane. Systems of this type are known for producing panes and normally have at least one heating tunnel upstream of a pressing unit. The temperature during pressing is, for example, from 40° C. to 150° C. Combinations of calender and autoclave methods have proven particularly successful in practice. Vacuum laminators can be used as an alternative. These consist of one or more heatable and evacuable chambers, in which the first pane and the second pane are laminated within, for example, approx. 60 minutes at reduced pressures of 0.01 mbar to 800 mbar and temperatures from 80° C. to 170° C.

A further aspect of the invention relates to a method for breaking detection of a ribbon cable according to the invention or a connection assembly according to the invention, wherein a) a ribbon cable according to the invention or a connection assembly according to the invention is provided, b) an ohmic reference resistance value $R_{Ref}$ measured or calculated between the ends of the, preferably undamaged, additional conductor track, c) the ohmic resistance $R_{Mess}$ between the ends of the additional conductor track, and the resistance $R_{Mess}$ is compared to the reference resistance value $R_{Ref}$.

In an advantageous embodiment of the method according to the invention, the ribbon cable is considered defective if the measured ohmic resistance $R_{Mess}$ deviates by more than 5%, preferably more than 10% and particularly preferably by more than 50%, from the ohmic reference resistance value $R_{Ref}$. In particular, the ribbon cable is considered defective if the measured ohmic resistance $R_{Mess}$ is more than 5%, preferably more than 10% and particularly preferably is more than 50% higher than the ohmic reference resistance $R_{Ref}$.

The ohmic reference resistance value $R_{Ref}$ can be easily calculated or measured by the person skilled in the art. If the additional conductor track is damaged, typically higher ohmic measured resistance $R_{Mess}$ than the reference resistance value $R_{Ref}$ results. As a result, a defect of the ribbon cable, and in particular a break of the conductor tracks, can be deduced. Measured ohmic resistance values $R_{Mess}$ with lower resistance can indicate a short-circuit within the ribbon cable.

In an advantageous embodiment of the method according to the invention, step c) is carried out before and/or after the ribbon cable is arranged in a connection assembly.

In a further advantageous embodiment of the method according to the invention, step c) is carried out repeatedly, preferably before and/or after the ribbon cable is arranged in a connection assembly.

A further aspect of the invention relates to the use of a ribbon cable according to the invention or a connection assembly according to the invention as building glazing or vehicle glazing, preferably as vehicle glazing, in particular as a windshield or a roof panel of a motor vehicle.

The various embodiments of the invention may be implemented individually or in any combinations. In particular, the features mentioned above and to be explained below can be used not only in the specified combinations, but also in other combinations or alone without departing from the scope of the present invention.

Figure 1B:
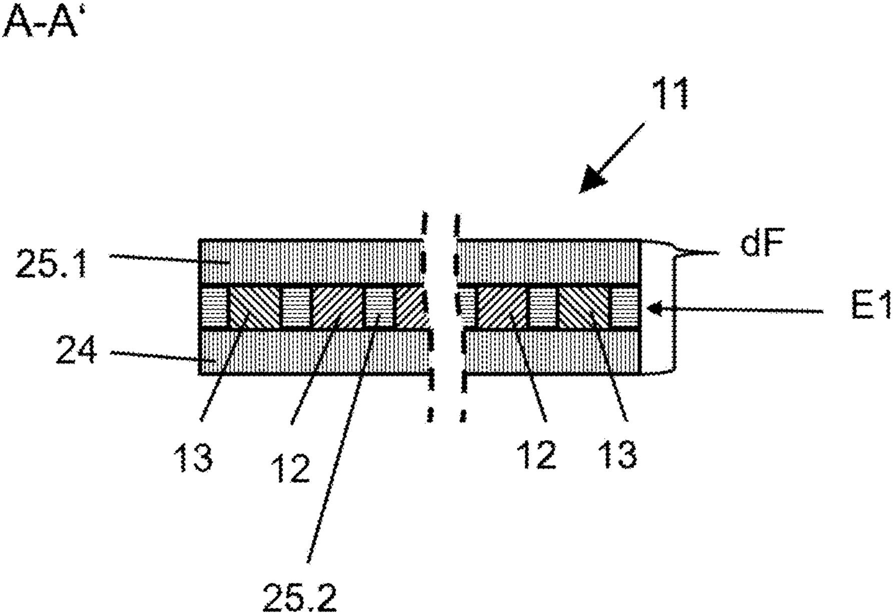
FIG. 1B is a schematic cross-sectional view along the section line A-A' of the ribbon cable according to the invention according to FIG. 1A.
Figure 2:
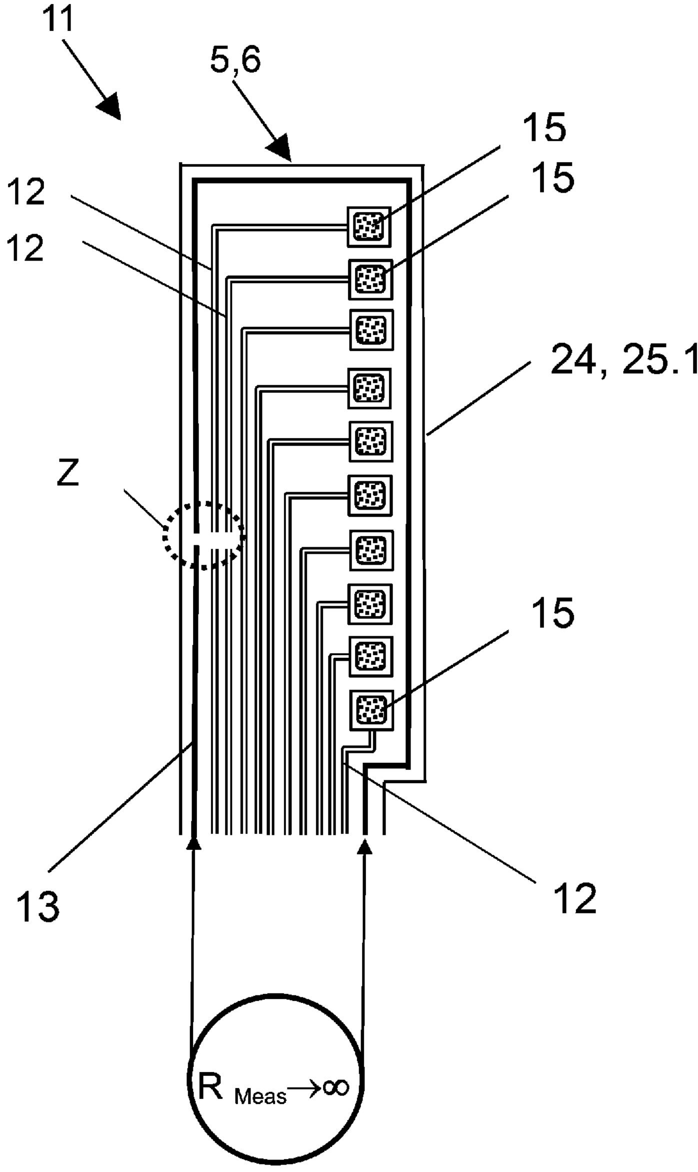
FIG. 2 is a schematic representation of the ribbon cable according to FIG. 1A with a defect.

Reference is first made to FIGS. 1A, 1B and 2, in which a ribbon cable denoted overall by the reference numeral 11 is schematically illustrated.

FIG. 1A shows a schematic representation of the first connection region 6 of a ribbon cable 11 according to the invention. The first connection region 6 is located at a first end 5 of the ribbon cable 11.

FIG. 1B shows a schematic cross-sectional view along the section line A-A' of the ribbon cable 11 according to the invention according to FIG. 1A.

For example, ten electrical conductor tracks 12 are arranged on a polymeric carrier film 24 and are bonded, for example, to the carrier film 24. The electrical conductor tracks 12 each open into a terminal electrode 15. Furthermore, an additional conductor track 13 is guided on the carrier film 24 substantially in a U-shaped manner around the first connection region 6 within the edge region of the carrier film 24. The additional conductor track 13 is, for example, glued to the carrier film 24. The distance from the additional conductor track 13 to the edge of the carrier film 24 is, for example, 3 mm.

The electrical conductor tracks 12 and the additional conductor track 13 consist, for example, of a thin copper, silver, tin, or gold film. The films can additionally be coated, e.g., silver-plated, gold-plated, or tin-plated. The thickness of the films is, for example, 35 μm, 50 μm, 75 μm, or 100 μm.

The carrier film 24, the electrical conductor tracks 12 and the additional conductor track 13 are covered with a cover film 25.1 and preferably glued thereto. A ribbon cable 11 is thus produced with embedded conductor tracks 12, 13, which are electrically insulated on the outside. The cover film 25.1 or the carrier film 24 are typically excluded in the regions of the terminal electrodes 15, so that the ribbon cable 11 can be electrically contacted there. Further portions of an insulating film 25.2 can be arranged between the individual conductor tracks 12, 13 and between the additional conductor track 13 and the edge of the carrier film 24.

For the material of the carrier film 24, films made of polyimide, and preferably black or yellow polyimide films (e.g., PI-MTB/MBC), for example, having a thickness of 25 μm or of 50 μm, are particularly suitable. Alternatively, polymer films made of PEN, preferably of white, black or transparent PEN, for example with a thickness of 25 μm, may be used.

For the material of the cover film 25.1 and, where applicable, as insulating film 25.2, films made of polyimide, and preferably black or yellow polyimide films (e.g., PI-MTB/MBC), for example having a thickness of 25 μm, are particularly suitable. Alternatively, polymer films made of PEN, and preferably of white PEN, for example having a thickness of 25 μm, may be used.

Adhesive layers between carrier film 24, cover film 25.1, insulating film 25.2, electrical conductor track 12 and/or additional conductor track 13 can, for example, contain or consist of epoxy adhesives or thermoplastic adhesives. Typical thicknesses of the adhesive films are 25 μm to 35 μm. The adhesives may be transparent or colored, e.g., black.

By measuring the ohmic resistance R of the auxiliary line 13, for example via connections in the second connection region 8, damage to the ribbon cable 11 and the electrical conductor tracks 12 contained therein can be determined. The measurement can take place in a punctiform or continuous manner. When measuring the ohmic resistance R of an undamaged additional line 12, a low reference resistance value $R_{Ref}$ of typically a few milliohms (mohm) results. In FIG. 2 shows a schematic representation of the ribbon cable 11 according to FIG. 1A with a defect in a breaking region Z. In the breaking region Z, the two electrical conductor tracks 12 arranged on the left in the figure and the additional conductor track 13 are damaged and interrupted. The measured ohmic resistance value $R_{Mess}$ of the additional conductor track 13 is then very high, typically in the kiloohm (kohm) or megaohm (Mohm) range.

Such damage often results from excessive loading of the ribbon cable 11, for example after lamination into a laminated pane and bending of the ribbon cable 11 around a disk edge.

Figure 3A:
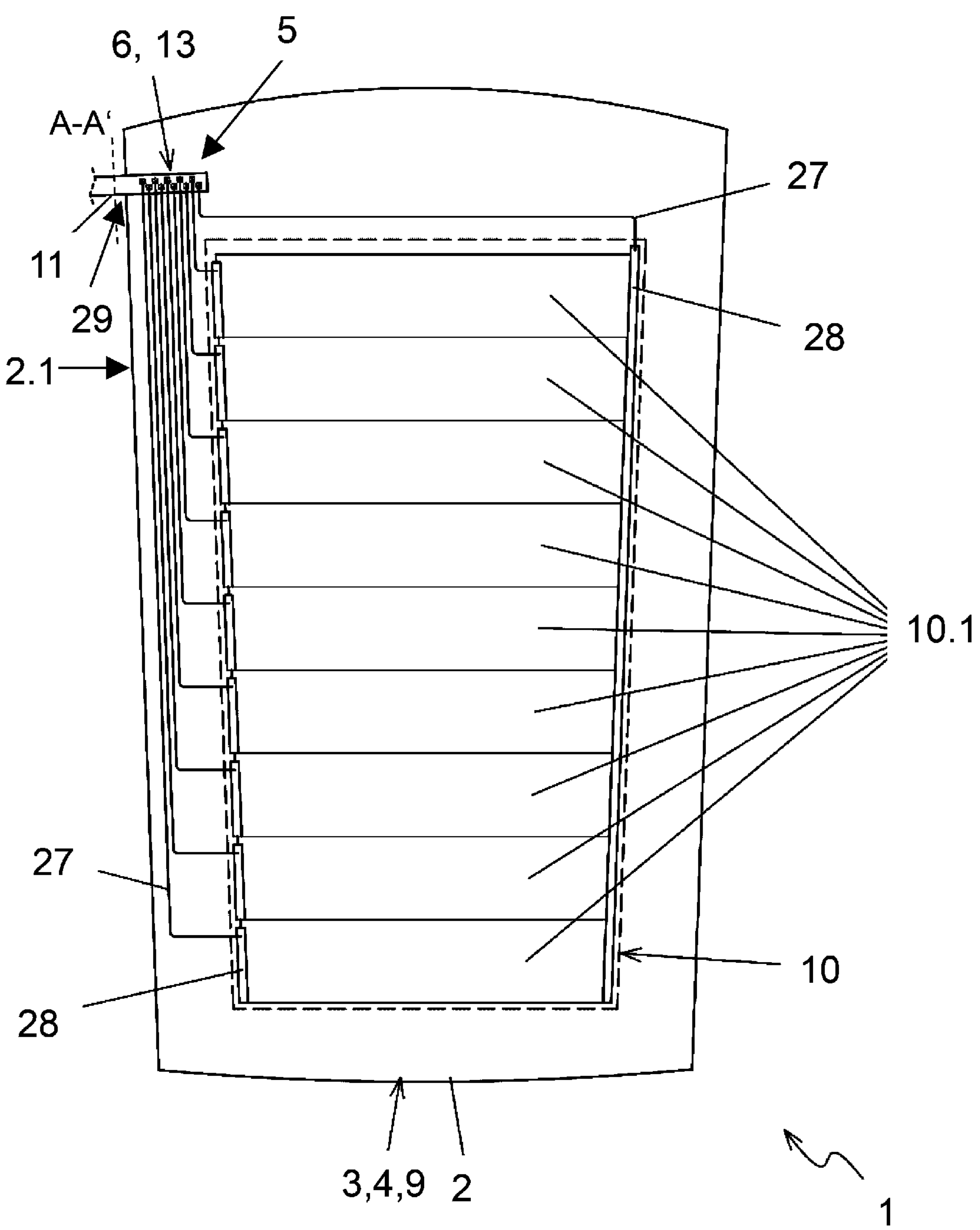
FIG. 3A is a schematic plan view of a laminated pane of a connection assembly according to the invention.
Figure 3B:
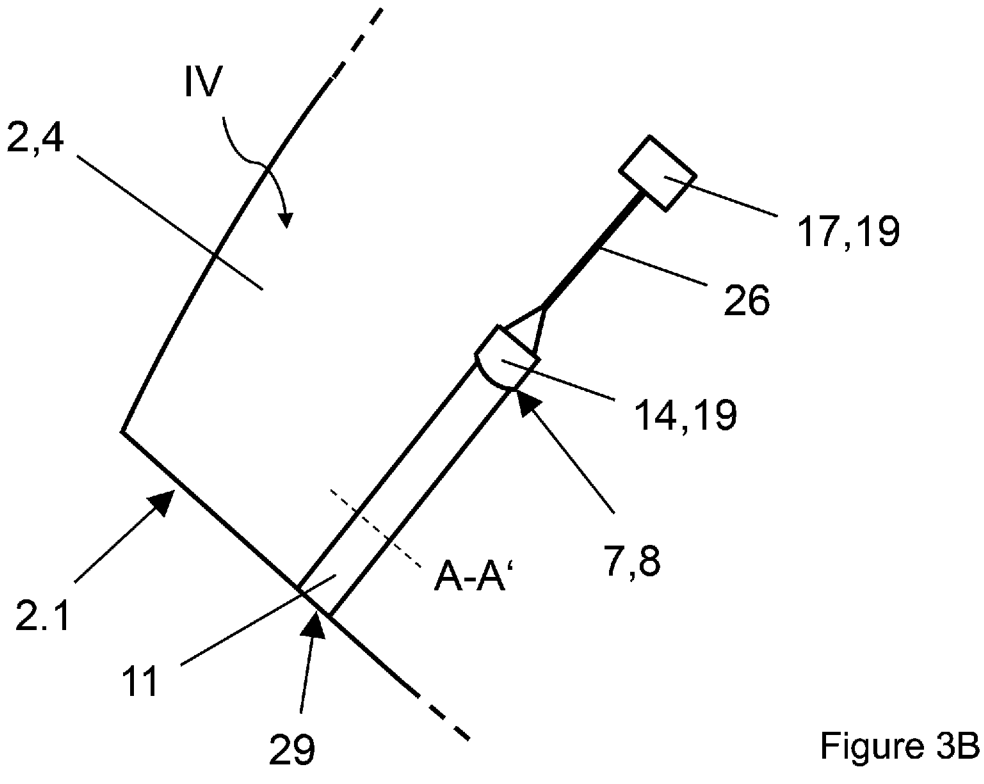
FIG. 3B is a detailed view of the connection assembly of FIG. 3A.
Figure 3C:
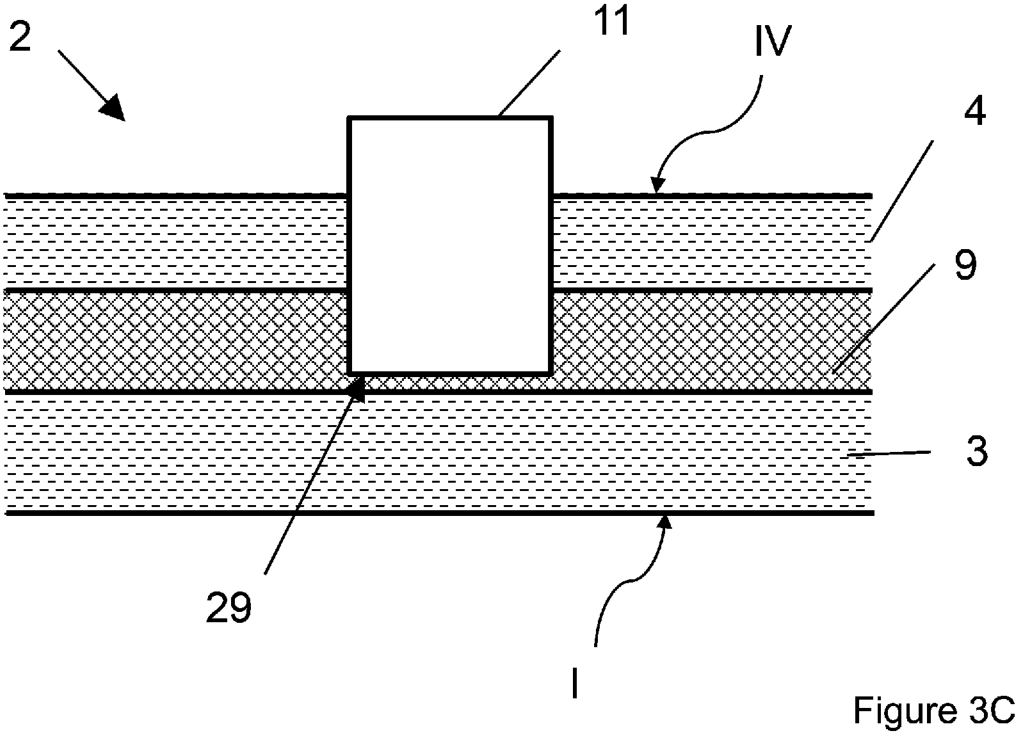
FIG. 3C is a detailed view of a side face of the laminated pane of the connection assembly of FIG. 3A.

Furthermore, reference is made to FIGS. 3A, 3B and 3C, in which a connection assembly denoted overall with the reference numeral 1 is schematically illustrated.

FIG. 3A shows a view through a laminated pane designated overall with the reference numeral 2.

FIG. 3B shows a detail of the laminated pane 2 in a plan view in the region in which a ribbon cable 11 according to the invention is guided out of the side face 2.1 of the laminated pane 2.

FIG. 3C shows a detail of the connection assembly 1 of FIG. 3A in a detailed view of a side face 2.1 of the laminated pane 2.

The connection assembly 1 comprises a laminated pane 2 which is designed here, for example, as a roof panel of a motor vehicle. As shown schematically in FIG. 3C, the laminated pane 2 comprises a first pane 3, which serves as an outer pane, and a second pane 4 as an inner pane. In this case, the inner pane is the pane directed towards the vehicle interior, while the outer pane points towards the vehicle environment. The surface of the outer pane that faces the vehicle environment (first pane 3) is referred to as surface I, as is usual in vehicle glazing technology, and the surface of the inner pane that faces the vehicle interior (second pane 4) is referred to as surface IV. The two panes 3, 4 consist, for example, of soda-lime glass. The two panes 3, 4 are fixedly connected to one another by two thermoplastic intermediate layers 9, for example made of polyvinyl butyral (PVB), ethylene vinyl acetate (EVA), or polyurethane (PU).

The laminated pane 2 is provided with an electrical functional element 10, which is located between the two panes 3, 4 and which is likewise shown merely schematically. The electrical functional element 10 may, for example, be a PDLC functional element which serves, for example, as an electrically controllable sun or privacy screen. The PDLC element is formed by a commercially available PDLC multilayer film which is embedded in the intermediate layer 9. For this purpose, the intermediate layer 9 comprises, for example, a total of three thermoplastic films (not shown) with a thickness of, for example, 0.38 mm of PVB, wherein a first thermoplastic film is connected to the first pane 3, and a second thermoplastic film is connected to the second pane 4, and wherein an intermediate thermoplastic frame film has a cutout into which the cut-to-size functional element 10 is inserted precisely. The third thermoplastic film thus forms as it were a kind of mount for the functional element 10, which is thus encapsulated by the thermoplastic material and protected thereby. This embedding of the PDLC element into a laminated pane 2 is well known to a person skilled in the art, so that a precise description is unnecessary. As is further known to a person skilled in the art, the PDLC element generally comprises an active layer between two flat electrodes and two carrier films. The active layer contains a polymer matrix with liquid crystals which are dispersed therein and which align as a function of the electrical voltage S applied to the planar electrodes, whereby the optical properties can be controlled.

The functional element 10 is here subdivided, for example, by insulation lines into nine segments 10.1. The segments 10.1 are designed like strips. The insulation lines between the segments 10.1 have, for example, a width of 40 μm (micrometers) to 50 μm. They may, for example, have been introduced into the prefabricated multilayer film by means of a laser.

The insulation lines separate in particular the flat electrodes of the functional element 10 into strips insulated from one another, each having a separate electrical connection. The segments 10.1 are thus switchable independently of one another.

The respective flat electrodes of the segments 10.1 are each individually contacted on the one side via portions of bus bars 28 (shown on the left in FIG. 1) and on the opposite side via a common bus bar 28 (shown on the right in FIG. 1). For example, ten independent electrical line connections are thus required here to apply a voltage to the respective individual bus bar portions of the new segments 10.1 and to the one common bus bar 28.

The laminate pane 1 furthermore has a ribbon cable 11. The bus bars 28 of the segments 10.1 of the functional element 10 are in each case electrically conductively connected to the ribbon cable 11 via electrical conductor wires 27, for example. A reliable electrically conductive connection is preferably achieved here by soldering the connection.

The functional element 2 is a PDLC functional element, which functions as a controllable sun or privacy screen. The driver or another vehicle occupant can operate the PDLC functional element, for example, via a touch control element depending on the sun position.

For controlling the nine independent segments 10.1 with a common opposing pole, the ribbon cable 11 has, for example, ten electrically insulated electrical conductor tracks 12.

It is understood that the ribbon cable 11 can be adapted to the respective conditions of actual use and can extend, for example, across two, three, or four planes. Alternatively or in combination, more or fewer conductor tracks per planes can be arranged next to one another.

As illustrated in the schematic realization as per FIG. 3B, the ribbon cable 11 is partially laminated into the laminated pane 2 and guided out of the laminated pane 2 between the two panes 3, 4. In FIG. 3B, the ribbon cable 11 is guided around the side face 2.1 of the second pane 4 and arranged on the surface IV of the second pane 4. For this purpose, the second pane 4 can have a recess, for example via a ground region (not shown here) in the exit region.

The ribbon cable 11 has a first connection region 6 and a second connection region 8, wherein the first connection region 6 is located at a first end 5 and the second connection region 8 is located at a second end 7 of the ribbon cable 11 along an extension direction of the ribbon cable 11. In the first connection region 6, the ribbon cable 11 has an electrode field with ten terminal electrodes 15 for electrical (e.g., galvanic) contacting of the functional element 10.

The ribbon cable 11 has a second connection region 8 at its second end 7. This is connected via a connecting element 14 to a round cable 26 in such a way that, for example, the individual conductor tracks 12 and the two ends of the additional conductor track 13 are each electrically contacted with individual cores of the round cable 26. At the end of the round cable 26 remote from the connecting element 14, for example, connection element 17, for example a plug or a socket, can be arranged for the further electrical connection, for example with an on-board electronics system.

The connecting element 14 and/or the connection element 17 can, for example, be arranged within a protective housing 19, which protects the connecting element 17 and/or the connection element 17 from mechanical damage during the lamination process.

LIST OF REFERENCE SIGNS

1 Connection assembly
2 Laminated pane

2.1 Side or exit face
3 First pane
4 Second pane
5 First end
6 First connection region
7 Second end
8 Second connection region
9 intermediate layer
10 Electrical functional element
10.1 Segments
11 ribbon cable
12 Conductor track
13 Additional conductor track
14 Connecting region
15 Terminal electrode
17 Socket or plug
19 Protective housing
24 Carrier film
25.1 Cover film
25.2 Insulating film
26 Round cable
27 Conductor wire
28 bus bar
29 Exit point
bF (maximum) width of the ribbon cable 11
bL (maximum) width of the conductor track 12
dF (maximum) thickness of the ribbon cable 11
dL (maximum) thickness of the conductor track 12
E1 Plane 1
A-A' Cutting line
Z Fracture region
I, IV Surface

The invention claimed is:

1. A ribbon cable having an additional conductor track for breaking detection, comprising:

a carrier film having at least one electrical conductor track, wherein the carrier film has a first connection region at a first end and a second connection region at a second end, wherein the first connection region is configured to be arranged between two panes of a laminated pane and the second connection region is configured to be guided out of the laminated pane between the two panes, and wherein the at least one electrical conductor track is configured to electrically contact an electrical functional element in the first connection region, wherein the carrier film has an additional conductor track which is configured to be loop-shaped, so that an ohmic resistance between two ends of the additional conductor track can be measured, and wherein the two ends of the additional conductor track terminate in the second connection region such that an ohmic resistance value between the two ends of the additional conductor track is measurable via the second connection region.

2. The ribbon cable according to claim 1, wherein the additional conductor track is arranged in an edge region of the carrier film.

3. The ribbon cable according to claim 1 wherein the additional conductor track is guided substantially in a U-shaped manner around the first connection region.

4. The ribbon cable according to claim 1, wherein the at least one electrical conductor track and the additional conductor track are arranged next to one another in one plane or one above the other in at least two planes.

5. The ribbon cable according to claim 4, wherein the at least one electrical conductor track and the additional conductor track are arranged in exactly two or exactly three or exactly four planes.

6. The ribbon cable according to claim 1, wherein the at least one electrical conductor track is arranged on a first surface of an electrically insulating carrier film and at least one further conductor track is arranged on a second surface of the electrically insulating carrier film.

7. The ribbon cable according to claim 1, wherein the at least one electrical conductor track and the additional conductor track are fixedly connected to a first surface or a second surface of the carrier film.

8. The ribbon cable according to claim 7, wherein the at least one electrical conductor track and the additional conductor track are fixedly connected to the first or second surface of the carrier film via an adhesive surface.

9. A connection assembly comprising:

a laminated pane formed of a first pane and a second pane, which are connected areally to one another via a thermoplastic intermediate layer, an electrical functional element which is arranged between the first and second panes, a ribbon cable according to claim 1, wherein the first connection region is arranged between the first and second panes and the second connection region is guided out of the laminated pane between the first and second panes, and wherein the at least one electrical conductor track electrically contacts the electrical functional element in the first connection region.

10. A method for breaking detection, comprising:

a) providing a ribbon cable according to claim 1 or a connection assembly, b) measuring or calculating an ohmic reference resistance value $R_{Ref}$ between the ends of an undamaged additional conductor track, c) measuring an ohmic resistance between the ends of the additional conductor track and comparing the measured resistance value $R_{Mess}$ to the reference resistance value $R_{Ref}$.

11. The method according to claim 10, wherein the ribbon cable is considered defective if the measured ohmic resistance value $R_{Mess}$ deviates from the ohmic reference resistance value $R_{Ref}$.

12. The method according to claim 11, wherein the ribbon cable is considered defective if the measured ohmic resistance value $R_{Mess}$ is increased from the ohmic reference resistance value $R_{Ref}$.

13. The method according to claim 12, wherein the ribbon cable is considered defective if the measured ohmic resistance value $R_{Mess}$ is increased by more than 5% from the ohmic reference resistance value $R_{Ref}$.

14. The method according to claim 13, wherein the ribbon cable is considered defective if the measured ohmic resistance value $R_{Mess}$ is increased by more than 10% from the ohmic reference resistance value $R_{Ref}$.

15. The method according to claim 14, wherein the ribbon cable is considered defective if the measured ohmic resistance value $R_{Mess}$ is increased by more than 50% from the ohmic reference resistance value $R_{Ref}$.

16. The method according to claim 10, wherein the step c) is performed before and/or after the ribbon cable is arranged in a connection assembly.

17. The method according to claim 10, wherein the step c) is carried out repeatedly, preferably before and/or after the ribbon cable is arranged in a connection assembly.

18. A method comprising providing a ribbon cable according to claim 1 or a connection assembly as a building glazing or vehicle glazing.

19. The method according to claim 18, wherein the vehicle glazing is a windshield, side panel, rear windshield or roof panel of a motor vehicle.

20. The ribbon cable according to claim 1, wherein the carrier film has at least two electrical conductor tracks.

* * * * *